US009075581B2

(12) United States Patent
Stock et al.

(10) Patent No.: US 9,075,581 B2
(45) Date of Patent: Jul. 7, 2015

(54) APPARATUS AND METHOD FOR COOLING ELECTRICAL COMPONENTS OF A COMPUTER

(75) Inventors: Michael Stock, Fairfax, VA (US); Brenda Campbell, Woodbridge, VA (US); Jonathan Robbins, Richmond, VA (US)

(73) Assignee: GERMANE SYSTEMS, LLC, Chantilly, VA (US)

( * ) Notice: Subject to any disclaimer, the term of this patent is extended or adjusted under 35 U.S.C. 154(b) by 979 days.

(21) Appl. No.: 13/089,623

(22) Filed: Apr. 19, 2011

(65) Prior Publication Data

US 2012/0268890 A1   Oct. 25, 2012

(51) Int. Cl.
*G06F 1/20* (2006.01)
*H05K 7/20* (2006.01)

(52) U.S. Cl.
CPC .............. *G06F 1/20* (2013.01); *H05K 7/20145* (2013.01); *H05K 7/20727* (2013.01)

(58) Field of Classification Search
CPC ... G06F 2200/201; G06F 1/20; H05K 1/0206; H05K 1/0203; H05K 7/20754; H05K 7/20745; H05K 7/20572; H05K 7/20145; H05K 7/20154; H05K 7/20163; H05K 7/20563; H05K 7/20727; H01L 23/427; H01L 23/4006; H01L 23/4093; H01L 23/467; H01L 23/473; H01L 2023/405; H01L 2924/14
USPC ..................................................... 361/679.53
See application file for complete search history.

(56) References Cited

U.S. PATENT DOCUMENTS

| | | | |
|---|---|---|---|
| 5,121,290 A | | 6/1992 | Azar |
| 5,630,469 A | * | 5/1997 | Butterbaugh et al. ........ 165/80.3 |
| 5,644,472 A | | 7/1997 | Klein |
| 5,822,188 A | * | 10/1998 | Bullington .................... 361/695 |
| 5,936,836 A | * | 8/1999 | Scholder ........................ 361/695 |
| 5,963,424 A | * | 10/1999 | Hileman et al. ............... 361/695 |
| 6,061,236 A | | 5/2000 | Klein |
| 6,094,345 A | * | 7/2000 | Diemunsch .................... 361/695 |
| 6,330,154 B1 | * | 12/2001 | Fryers et al. ................... 361/695 |
| 6,352,103 B1 | | 3/2002 | Chu et al. |
| 6,377,459 B1 | * | 4/2002 | Gonsalves et al. ............ 361/700 |
| 6,396,688 B1 | * | 5/2002 | Davies et al. ............. 361/679.48 |
| 6,452,797 B1 | * | 9/2002 | Konstad ......................... 361/695 |
| 6,462,948 B1 | * | 10/2002 | Leija et al. ..................... 361/697 |
| 6,504,718 B2 | * | 1/2003 | Wu ................................. 361/695 |
| 6,661,656 B2 | * | 12/2003 | Kim et al. ................ 361/679.33 |
| 6,721,180 B2 | * | 4/2004 | Le et al. ......................... 361/695 |
| 6,765,794 B1 | * | 7/2004 | Inoue ............................. 361/695 |

(Continued)

*Primary Examiner* — Robert J Hoffberg
(74) *Attorney, Agent, or Firm* — Nixon & Vanderhye P.C.

(57) ABSTRACT

A plenum for guiding a flow of cooling air through the interior of a computer is designed to maximize the airflow over those electrical components within the computer which are most sensitive to temperature, and/or which require the greatest amount of cooling. The plenum is designed to be mounted over top of a computer motherboard which includes a plurality of electrical components mounted thereon. One or more apertures are formed in the lower wall of the plenum so that electrical components mounted on the computer motherboard can protrude through the apertures and into the interior of the plenum. The lower surface of the plenum is designed to prevent the flow of cooling air passing through the plenum from escaping through the apertures on the lower wall. Also, upper and lower protrusions on the plenum can extend into the interior of the plenum to concentrate the flow of cooling air onto the electrical components which are protruding through the apertures and into plenum.

18 Claims, 10 Drawing Sheets

(56) References Cited

U.S. PATENT DOCUMENTS

| | | | |
|---|---|---|---|
| 6,865,078 B1* | 3/2005 | Chang | 361/695 |
| 7,228,889 B1* | 6/2007 | Tian et al. | 165/122 |
| 7,310,228 B2* | 12/2007 | Chen | 361/695 |
| 7,408,773 B2* | 8/2008 | Wobig et al. | 361/695 |
| 7,423,872 B2* | 9/2008 | Chen | 361/695 |
| 7,839,631 B2* | 11/2010 | Lee et al. | 361/679.49 |
| 8,405,987 B2* | 3/2013 | Lai | 361/695 |
| 8,432,697 B2* | 4/2013 | Tamanuki | 361/719 |
| 8,675,365 B2* | 3/2014 | Pav et al. | 361/720 |
| 2002/0134531 A1* | 9/2002 | Yanagida | 165/80.3 |
| 2002/0172008 A1* | 11/2002 | Michael | 361/697 |
| 2005/0030712 A1* | 2/2005 | Faneuf et al. | 361/687 |
| 2005/0041392 A1* | 2/2005 | Chen | 361/695 |
| 2006/0012957 A1* | 1/2006 | Arbogast et al. | 361/695 |
| 2007/0012427 A1* | 1/2007 | Liu et al. | 165/104.26 |
| 2007/0091564 A1* | 4/2007 | Malone et al. | 361/695 |
| 2007/0091566 A1* | 4/2007 | Sun | 361/695 |
| 2007/0256815 A1* | 11/2007 | Conway et al. | 165/80.4 |
| 2008/0062641 A1* | 3/2008 | Lai et al. | 361/695 |
| 2008/0123292 A1* | 5/2008 | Wobig et al. | 361/695 |
| 2009/0040717 A1* | 2/2009 | Liu | 361/695 |
| 2009/0310296 A1 | 12/2009 | Peng et al. | |
| 2010/0188815 A1* | 7/2010 | Yamagiwa | 361/692 |
| 2011/0182027 A1* | 7/2011 | Lima et al. | 361/679.46 |
| 2012/0020013 A1* | 1/2012 | Li | 361/679.47 |
| 2012/0050991 A1* | 3/2012 | Tamanuki | 361/697 |
| 2012/0063088 A1* | 3/2012 | Fu et al. | 361/697 |
| 2012/0067553 A1* | 3/2012 | Sun et al. | 165/104.34 |
| 2012/0134113 A1* | 5/2012 | Lai | 361/695 |
| 2012/0140408 A1* | 6/2012 | Chang | 361/679.53 |
| 2012/0160463 A1* | 6/2012 | Lai | 165/121 |
| 2013/0155613 A1* | 6/2013 | Chang et al. | 361/695 |
| 2014/0254097 A1* | 9/2014 | Kohn | 361/697 |

* cited by examiner

APPARATUS AND METHOD FOR COOLING ELECTRICAL COMPONENTS OF A COMPUTER

BACKGROUND OF THE INVENTION

Today's computer systems include many electrical components that produce significant amounts of heat. It is necessary to remove the heat from the electrical components, and from the computer enclosures, to prevent the components from overheating and becoming damaged or destroyed.

Most computer systems, including laptop computers, desktop computers and computer servers, include at least one cooling fan which generates a flow of cooling air that is directed over the electrical components that produce heat. Typically, ambient air is drawn into a computer housing through an inlet located on a first side of the computer housing, the air passes over the electrical components, and the air flow then exits through an outlet on a second opposite side of the computer housing.

While a flow of cooling air produced by one or more cooling fans is sufficient for many applications, in some high power and densely packaged computer systems, cooling fans alone are unable to remove a sufficient amount of heat from the enclosure to prevent damage to the electrical components, even when the air is at normal ambient temperatures. When the air used for cooling is at elevated temperatures, this problem becomes even worse.

To increase the amount of heat which can be removed from an enclosure by a flow of cooling air, some electrical components are attached to or mounted on heat sinks. The heat sinks typically have cooling fins that increase the amount of surface area which can be used for heat transfer to the flow of cooling air. While this helps to remove heat from the electrical components, even the use of heat sinks is insufficient in certain applications to prevent overheating.

For instance, in some situations a plurality of computer servers are mounted in a rack, and multiple racks of computer servers are located in the same room. In this type of environment, the amount of heat produced by all of the electrical components of all of the computer servers is dumped into the room, and this raises the ambient temperature within the room. The temperature differential between the temperature of the ambient air and the temperature of the electrical components is one of the key factors in the ability of a flow of cooling air to remove heat from the electrical components. When the ambient temperature rises, it can become impossible to remove a sufficient amount of heat from the electrical components to prevent damage.

For all the above reasons, in certain applications it is necessary to employ auxiliary cooling systems to help remove enough heat from the electrical components of a computer. The auxiliary cooling systems are usually employed to cool the air that is blown over the electrical components. And because the air used to cool electrical components of a computer system is drawn from the area immediately surrounding the computer enclosure, this usually means cooling the air in the room in which the computer system is located.

An auxiliary cooling system could simply be an air conditioning system that helps to cool the air in a room where multiple computers are located. In the case of a room with multiple racks of rack mounted servers, there may be specialized systems that generate cool air that is provided directly to the servers.

Unfortunately, providing the auxiliary cooling systems involves a significant extra expense. Also, it is necessary to provide electrical power to run such systems, and maintenance of the systems may also be required. Some such auxiliary cooling systems use water as a heat sink, which also requires significant water routing and handling systems. Moreover, in certain applications, such as aboard ships or submarines, the extra space required for the auxiliary cooling systems is problematic.

DETAILED DESCRIPTION OF PREFERRED EMBODIMENTS

Figure 1:
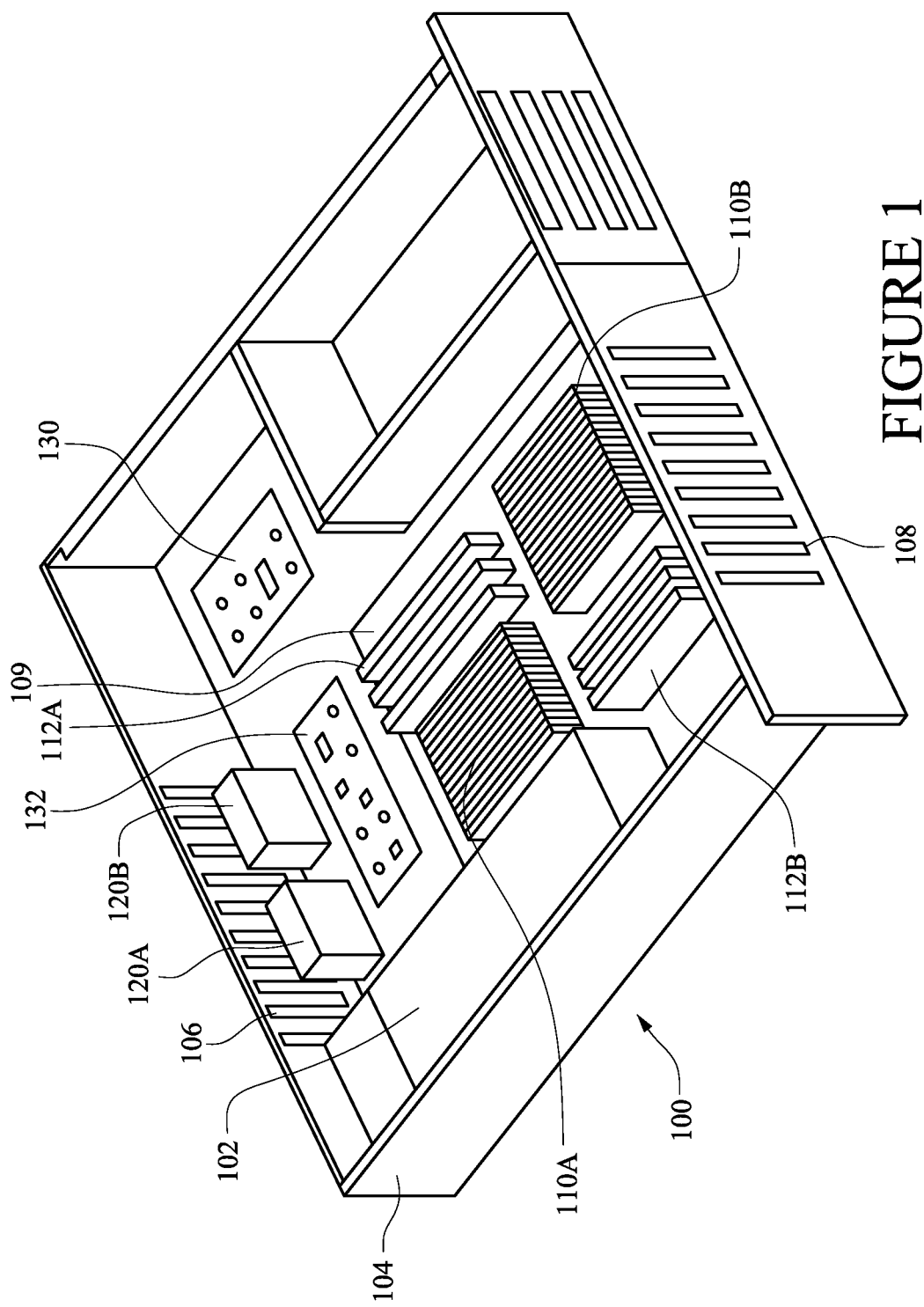
FIG. 1 is a perspective view of a computer server with the top cover removed.

A typical computer server is illustrated in FIG. 1. As shown therein, the computer server 100 includes an enclosure 104 which houses a power supply 102 and a computer motherboard 109. A variety of additional circuit boards 130, 132 may also be mounted at various locations within the enclosure 104.

The computer motherboard 109 has a first central processing unit 110A and a second central processing unit 110B mounted thereon. In addition, a plurality of memory modules 112A on the motherboard 109 may be coupled to the first central processor 110A. Likewise, a plurality of computer memory modules 112B on the motherboard 109 may be coupled to the second central processor 110B.

The central processors 110A, 110B and the memory modules 112A, 112B both produce significant amounts of heat which must be removed to ensure that these electrical components do not become damaged or destroyed. In the embodiment illustrated in FIG. 1, the central processing units 110A, 110B are mounted on finned heat sinks to increase the amount of heat which can be removed from the central processors via a flow of cooling air.

First and second cooling fans 120A, 120B are mounted on one side of the interior of the enclosure 104. In some embodiments, the fans 120A, 120B draw a flow of ambient air into the enclosure through apertures 106 on the rear sidewall of the enclosure 104. The cooling fans 120A, 120B then blow the flow of cooling air over the electrical components, and the cooling airflow ultimately exits the enclosure 104 through apertures 108 formed on the front sidewall of the enclosure.

In alternate embodiments, the fans could be configured to blow the flow of cooling air in the opposite direction. In this instance, the fans draw a flow of cooling air into the enclosure 104 through the apertures 108 on the front sidewall of the enclosure. The flow of cooling air is drawn across the electrical components and the cooling fans 120A, 120B then blow the flow of cooling air out of the apertures 106 on the rear sidewall of the enclosure 104.

Some of the electrical components in a computer produce much larger amounts of heat energy than other electrical components. Likewise, certain electrical components are far more sensitive to temperature than other electrical components. Drawing or blowing a flow of cooling air across all of the electrical components in a computer is somewhat inefficient. Ideally, one would like to remove heat only from those electrical components that are most sensitive to temperature. Likewise one would prefer to apply cooling air to those electrical components that produce the greatest amounts of heat energy.

With an arrangement as depicted in FIG. 1, the cooling fans 120A, 120B simply draw or blow the flow of cooling air across all electrical components at the same time. The flow of cooling air is not concentrated on those components which are most sensitive to temperature and which produce the greatest amounts of heat energy.

Figure 2:
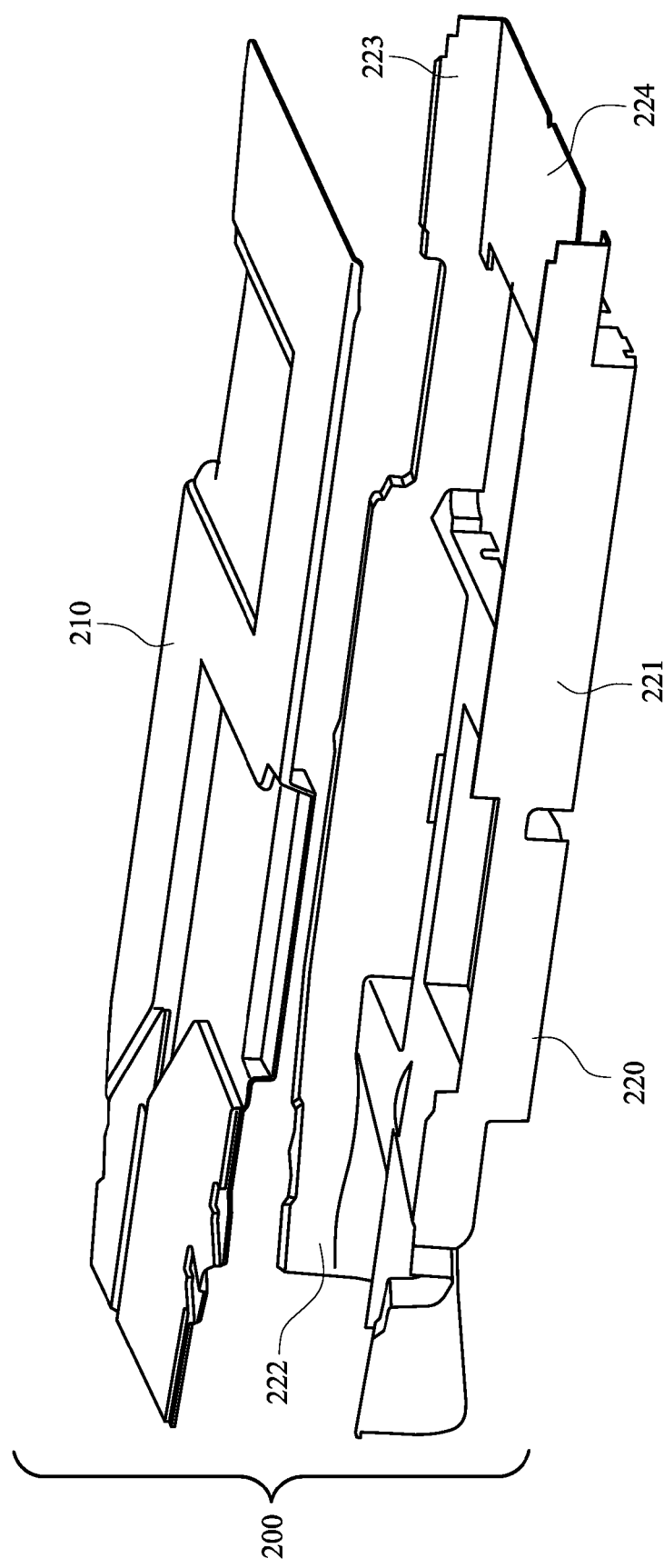
FIG. 2 is a perspective view of an air plenum for directing a flow of cooling air.

A plenum for directing the flow of cooling air is illustrated in FIG. 2. The plenum 200 includes a lower portion 220 and an upper portion 210. An inlet 222 is located on one side of the plenum, and an outlet 224 is located on the opposite side of the plenum.

Figure 5:
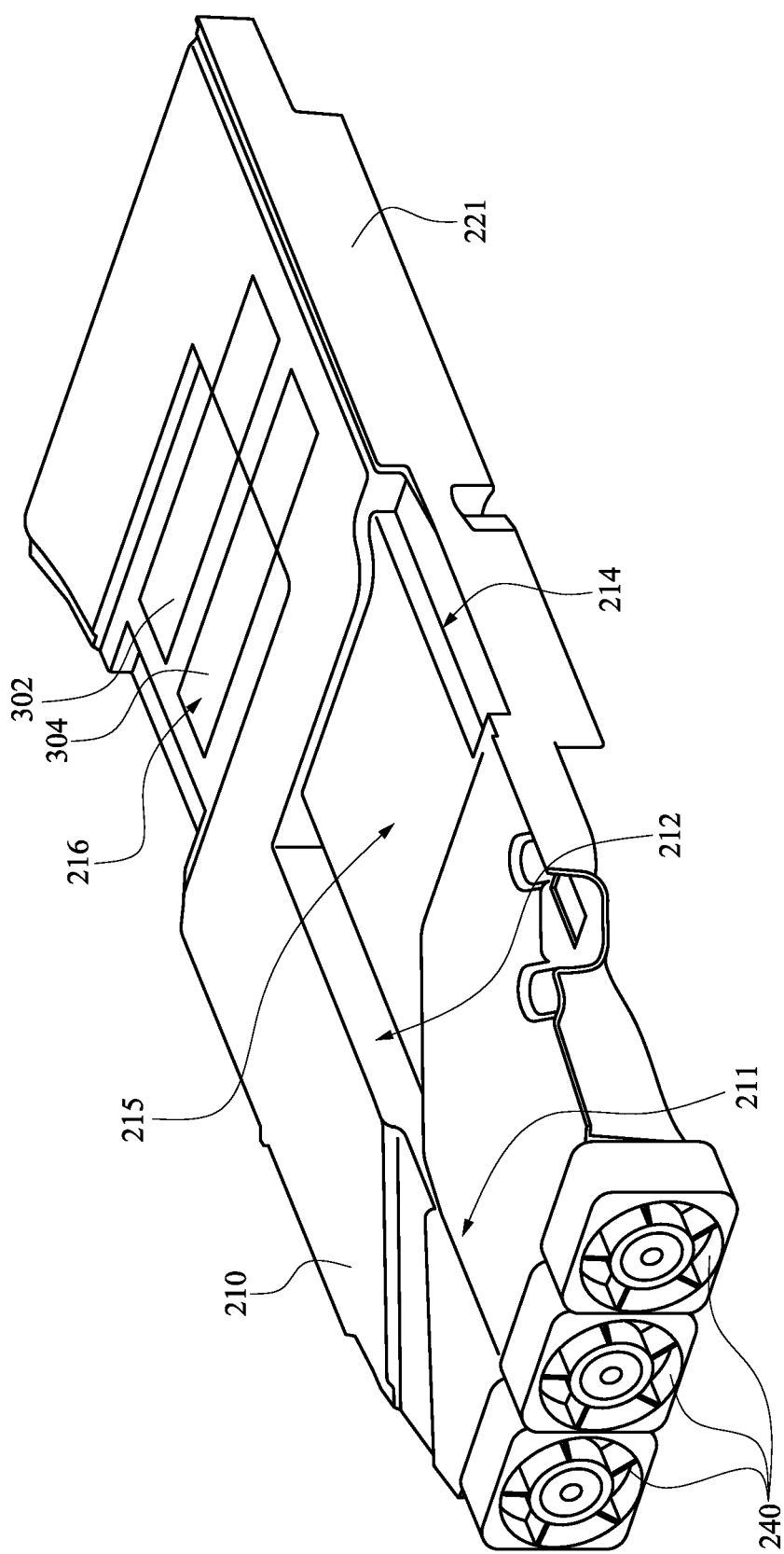
FIG. 5 is a perspective view of an air plenum which includes a plurality of cooling fans.

FIG. 5 shows the upper portion 210 and the lower portion 220 of a plenum for directing a flow of cooling air after they have been joined together. In addition, three cooling fans 240 are mounted in front of the inlet 222. The cooling fans 240 could cause a flow of cooling air to move in either direction so that the flow of cooling air is either blown by the cooling fans 240 into the inlet 222 and out the outlet 224, or so that the flow of cooling air is drawn into the outlet side 224 and the cooling airflow then exits the cooling fans 240 at the inlet side 222.

Figure 3:
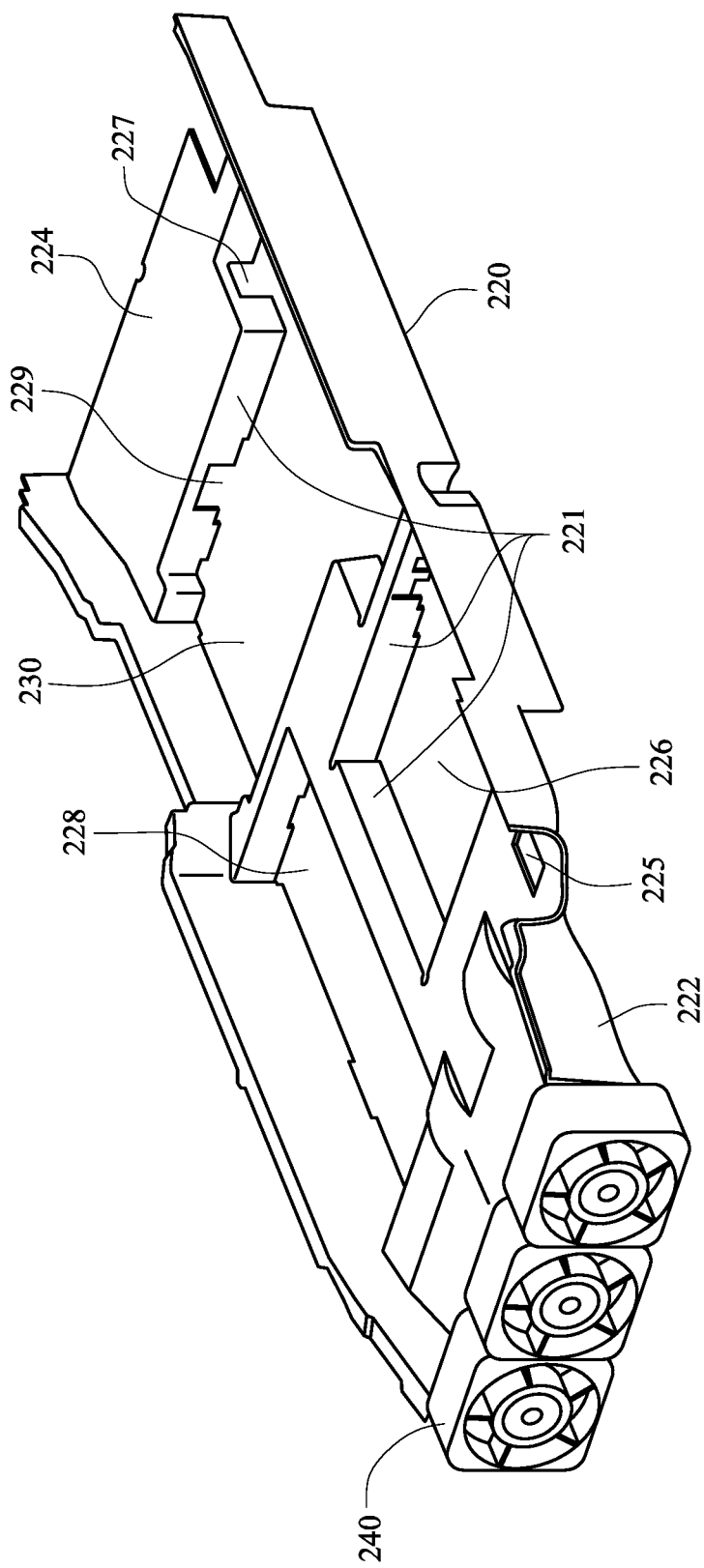
FIG. 3 is a perspective view of the lower portion of an air plenum for directing a flow of cooling air, with cooling fans mounted at one end of the plenum.

FIG. 3 is a perspective view of the lower portion 220 of the plenum with three cooling fans 240 mounted at the inlet side 222. As shown in FIG. 3, a plurality of apertures 225, 226, 228, 230 are formed on the lower wall of the lower portion 220 of the plenum. The lower portion 220 of the plenum is designed to be mounted over top of a computer motherboard which includes a plurality of electrical components mounted thereon. The apertures 225, 226, 228, 230 are configured so that certain electrical components on the computer motherboard will protrude upward through the apertures and into the interior of the air plenum.

Figure 4:
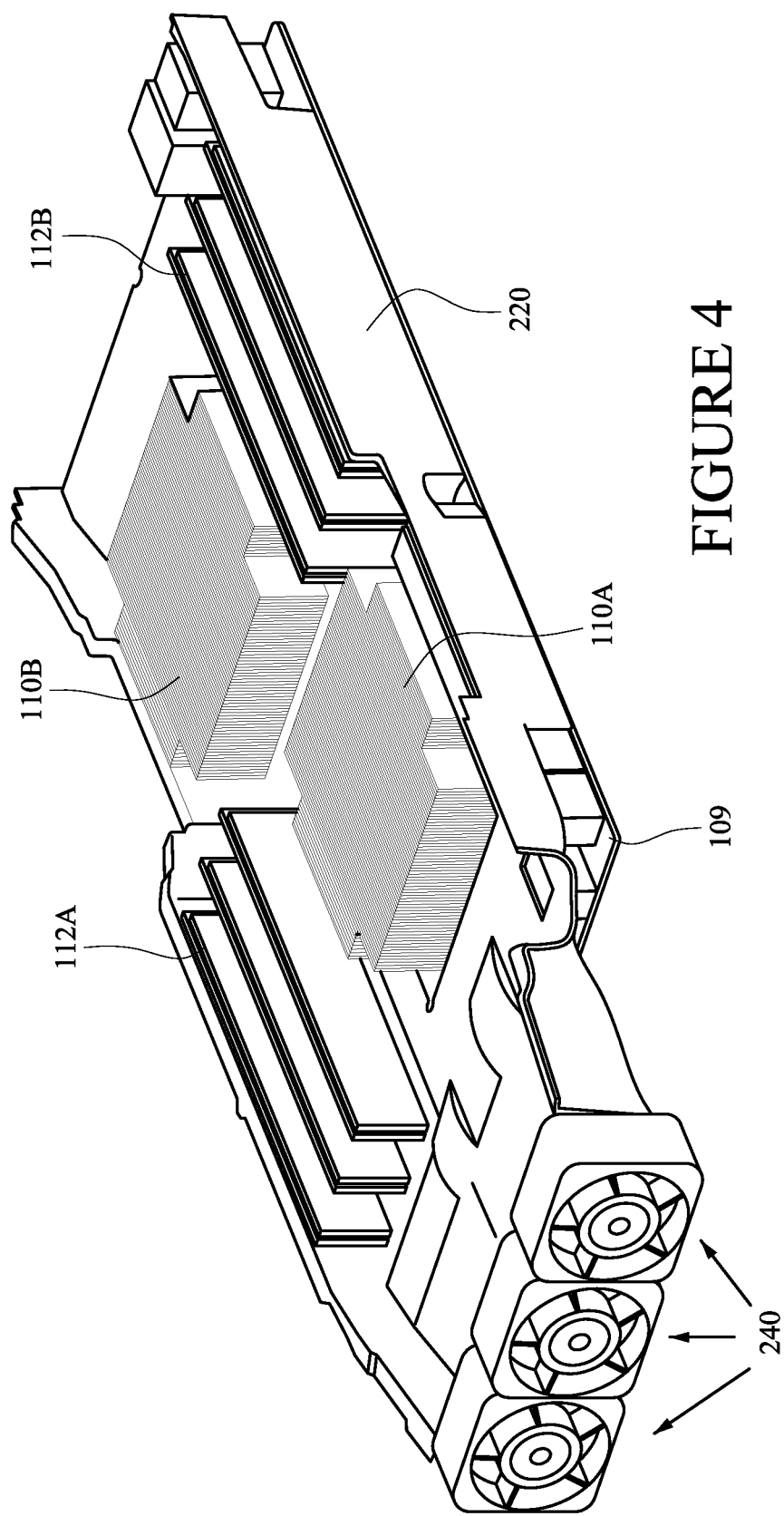
FIG. 4 is a perspective view of the lower portion of an air plenum for directing a flow of cooling air, with cooling fans mounted at one end of the plenum, where the plenum is mounted over top of a computer motherboard.

FIG. 4, shows the lower portion 220 of the air plenum after it has been mounted over top of a computer motherboard 109. As shown in FIG. 4, the cooling fins of a heat sink surrounding the first central processor 110A protrude upward through the aperture 226 formed on the lower surface of the lower portion 220 of the plenum. Likewise, memory modules 112A which are coupled to the first central processing unit 110A protrude upward through the aperture 228 on the lower surface of the lower portion 220 of the air plenum. Further, a second central processor 110B and memory modules 112B protrude upward through the aperture 230 on the lower surface of the lower portion 220 of the plenum.

As illustrated in FIG. 4, the lower wall of the lower portion 220 of the plenum also covers many of the other electrical components which are mounted on the computer motherboard. As illustrated in FIG. 3, a variety of vertically extending portions 221 of the lower wall are designed to extend downward to engage, or at least come close to, the top surface of the underlying computer motherboard. Various cutouts 227, 229 may be formed in the vertically extending portions 221 to accommodate upwardly protruding electrical components on the computer motherboard. The vertically extending portions 221 are configured to prevent cooling air flowing through the plenum from escaping through the apertures in the lower wall of the plenum.

When the lower portion 220 of the plenum is carefully matched to the configuration of the underlying motherboard, the flow of air through the plenum is concentrated on only selected electrical components mounted on the computer motherboard which extend upward through the apertures and into the interior of the air plenum. This concentrates the flow of cooling air on only those electrical components which are most sensitive to temperature, and which require the greatest amount of cooling.

As illustrated in FIG. 5, the upper portion 210 of the plenum can be contoured to match the shape and height of the electrical components that extend upward into the interior of the plenum. For instance, the upper portion of the plenum can include an upper protrusion 212 which extends downward into the interior of the plenum. The upper protrusion 212 would extend down into the area located between the first central processor 110A and the memory modules 112A which are coupled to the first central processor 110A. This ensures that all of the flow of cooling air passing through this portion of the plenum is directed over the first central processor 110A and the memory modules 112A. No portion of the flow of cooling air is allowed to pass through the space located between the first central processor 110A and the memory modules 112A. This further concentrates the flow of cooling air on those elements which are most sensitive to temperature and which require the greatest amount of cooling.

As also illustrated in FIG. 5, similar upper protrusions 215, 216 extend downward towards the upper surfaces of the heat sinks in which the first central processor 110A and the second central processor 110B are located. By shaping that the upper portion 210 of the plenum so that it is almost in contact with the upper surfaces of the various electrical components that protrude into the plenum, none of the flow of cooling air is allowed to bypass the electrical components by flowing over top of the electrical components.

Two factors that affect how much heat energy can be transferred between an electrical component and a flow of cooling air are the temperature difference between the electrical component and the cooling air, and the flow rate of the cooling air. The greater the flow rate, the more heat energy can be transferred.

The plenum may be shaped to increase the flow rate at selected locations, to thereby increase the amount of heat energy that can be transferred to the cooling air from an electrical component at that location. As noted above, the upper portion 210 of a plenum may extend downward at selected locations, to thereby increase the flow rate at those locations. Similarly, the bottom wall and sidewalls of a plenum can likewise be shaped to increase the flow rate at selected locations within the plenum.

Figure 6:
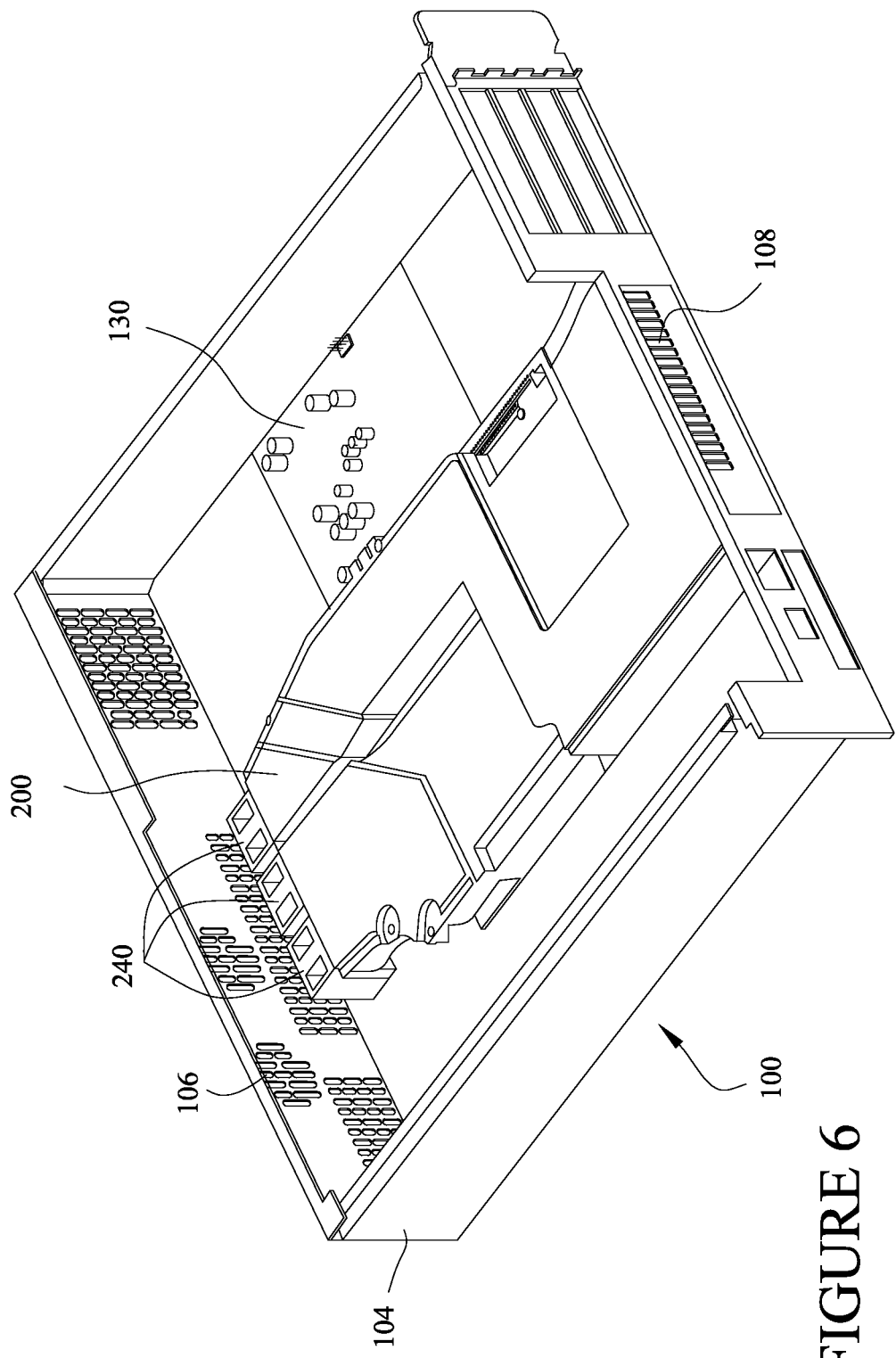
FIG. 6 is a perspective view of a computer server with an air plenum for directing a flow of cooling air mounted over top of a motherboard in the server.

FIG. 6 illustrates a computer server 100 where a plenum 200 for guiding a flow of cooling air has been installed over top of a computer motherboard. As shown in FIG. 6, the cooling fans 240 would generate a flow of cooling air which is directed over only those electrical components which extend through the apertures on the lower surface of the plenum and into the interior of the plenum. The flow of cooling air generated by the cooling fans 240 does not pass over any electrical components on the computer motherboard that do not protrude through the apertures on the lower surface of the plenum, nor does the flow of cooling air pass over any of the other circuit boards 130 which are mounted within the enclosure 104.

By maximizing the flow of cooling air over only those electrical components which are most sensitive to temperature, the plenum helps to ensure that none of the sensitive electrical components overheat. Also, by removing heat from those electrical components that generate the most heat energy, the plenum helps to prevent the heat generated by those components from migrating to and heating other surrounding electrical components.

When a computer is equipped with a plenum as described above, it is possible to provide a sufficient amount of cooling to prevent damage to the computer with either a lower flow rate of cooling air, or with higher temperature ambient air, than if the computer lacked the plenum. Also, because only those components that are most sensitive to heat are being cooled, the amount of heat that is dumped into the surrounding atmosphere is lower. This helps to keep the ambient air at a lower temperature, which itself aids in cooling the computers located in that space.

The use of a plenum as described above makes it possible to provide a given number of computers in a confined space with sufficient cooling to prevent damage without the need for auxiliary cooling systems which would otherwise be required. Because auxiliary cooling systems are not required, one can save the cost of such systems, the power to run such systems, as well as the space required to mount such auxiliary cooling systems. Further, one can save the lifetime cost of maintaining such auxiliary cooling systems.

In the embodiments illustrated in FIGS. 3-6, a plurality of cooling fans 240 are provided as part of the air plenum cooling system. In the illustrated embodiments, three cooling fans are used. However, in alternate embodiments fewer than three or greater than three cooling fans could be used.

A computer could include a controller for the cooling fans. The cooling fan controller can be configured to selectively vary the rotational speed of the fans, as required, to ensure that a sufficient flow rate of cooling air keeps the electrical components at a sufficiently low temperature. The controller could vary the cooling fan rotational speed in response to a temperature signal from a temperature sensor.

Similarly, the rotational speed of one or more cooling fans could be varied based on the operational conditions of various elements of a computer or server system. Rather than sensing the temperature of an electrical component and adjusting the flow rate of the cooling air based on temperature, the cooling fan controller could be supplied with information about the operational state of an electrical component, and the flow rate of the cooling air could be adjusted based on the operational condition.

For example, the cooling fan controller could be supplied with information about the amount of processing being conducted by a CPU. If the CPU is idle a large percentage of the time, then it will likely be producing only a small amount of heat energy, and the cooling fan or fans used to create a flow of cooling air for the CPU could be run at low speeds. On the other hand, if the CPU is active a large percentage of the time, the CPU would likely be producing a much larger amount of heat energy, and the cooling fan(s) could be run at high speeds to increase the flow rate of the cooling air.

Moreover, the controller could be configured to selectively vary the rotational speed of each of the cooling fans on an individual basis. As a result, a first cooling fan may be operating at a first flow rate, while a second cooling fan is operating at a second different flow rate.

For instance, in the illustrated embodiments, the center of the three cooling fans 240 could be operated at a greater flow rate than the two cooling fans on the outer sides of the plenum. This would ensure that a greater amount of air passes down the center of the air plenum. This may be desirable because more of the electrical components that extend into an interior of the plenum are located along the center of the plenum.

The throat element 260 and the cooling fans 240 could have varying sizes and configurations. For instance, in some applications it may only be necessary to provide two cooling fans 240 to keep a certain computer server at a sufficiently low temperature given its configuration, and the environment in which it is located. In other instances, such as where the ambient temperature is higher, it may be necessary to provide three cooling fans 240 to keep the same computer sever at a sufficiently low temperature. By providing the cooling fans on a separate throat element 260 which is then attached to the plenum, one can easily customize the same basic server and plenum for use in different environments.

Figure 7:
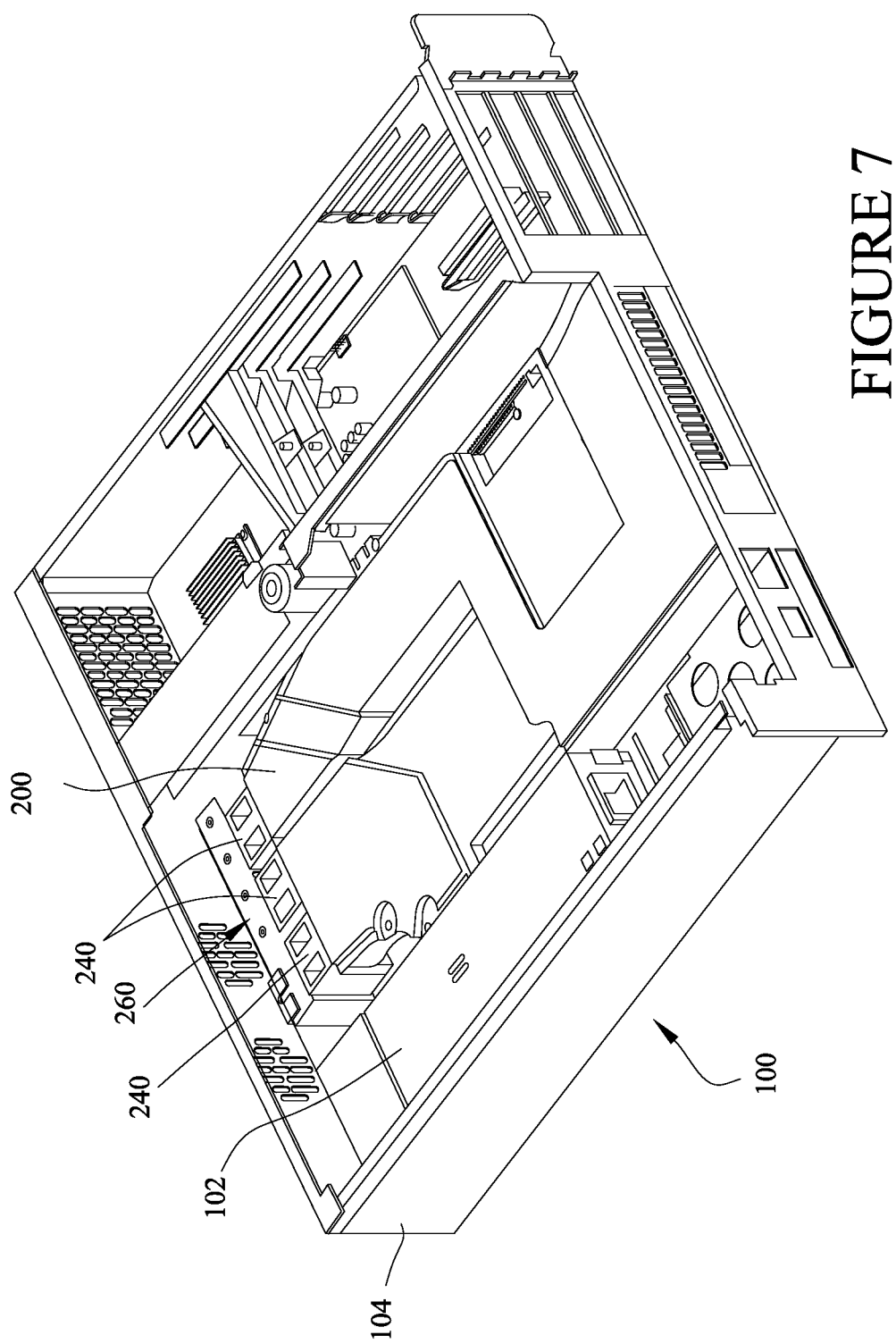
FIG. 7 is a perspective view of a computer server with an air plenum for directing a flow of cooling air which includes a throat portion.

FIG. 7 illustrates an embodiment which includes a separate throat element 260, upon which the cooling fans 240 are mounted. The throat element 260 and cooling fans 240 could be detachably mounted to one end of a plenum. Although this embodiment has the cooling fans located between the throat element 260 and the remainder of the plenum, in alternate embodiments, the positions of the throat element 260 and the cooling fans 240 might be reversed.

In still other embodiments, the cooling fans may be directly attached to the interior of a plenum. FIG. 3 shows the cooling fans 240 mounted outside the throat 222 of the plenum. In alternate embodiments, the cooling fans 240 could be mounted to the bottom and/or the sidewalls of the throat 22 of the plenum. The cooling fans 240 could also be attached to the upper portion 210 of the plenum, which is illustrated in FIG. 2.

FIGS. 6 and 7 illustrate embodiments where three cooling fans 240 are used. The rightmost cooling fan 240 draws air though a first passageway formed by the bottom and top portions of the plenum, the first passageway surrounding the memory modules 112A coupled to the first CPU 110A. The center and leftmost cooling fan 240 draw air through a second passageway that surrounds the first CPU 110A.

In this embodiment, two cooling fans are used to draw air through the second passageway so that the flow rate of cooling air through the second passageway is greater than the flow rate of cooling air through the first passageway. And the higher flow rate of cooling air through the second passageway is desirable to ensure that a sufficient amount of heat energy can be removed from the first CPU 110A to prevent the first CPU 110A from overheating.

In this embodiment, the CPUs 110A, 110B are more sensitive to overheating than the memory modules 112A, 112B. And the temperature of the air passing over the two CPUs is different. The cooling air drawn over the second CPU 110B enters the computer enclosure through the front wall and passes directly over the second CPU 110B. In contrast, the cooling air passing over the first CPU 110A enters the enclosure through the front wall and first passes over the memory modules 112B and/or the second CPU 110B before reaching the first CPU 110A. Thus, the temperature of the air has been raised higher than ambient before it reaches the first CPU 110A. And for this reason, it is necessary to provide a greater flow rate of cooling air passing over the first CPU 110A (as compared to the flow rate over the second CPU 110B) to provide the same amount of cooling to the first CPU 110A as was provided to the second CPU 110B. The greater flow rate of the cooling air within the second passageway, as provided by the center and leftmost cooling fans 240, ensures that a sufficient amount of heat energy is removed from the first CPU 110A to prevent damage to the first CPU 110A.

As explained above in conjunction with the embodiment illustrated in FIGS. 4-6, a plenum and associated cooling fans can be customized based on the cooling requirements of the electrical components, and based on the physical layout of the electrical components, to ensure that all components receive sufficient cooling. Customization factors include designing the plenum to create different interior passageways within the plenum. Where different passageways are formed, the fans may create different flow rates through the passageways. Also, within a single passageway, the interior cross-sectional area may be selectively varied to vary the flow rate of the cooling air. Further, the passageways may be shaped to ensure that the flow of cooling air passes directly over the electrical components that require cooling, and that the cooling air flow is not allowed to bypass critical components.

Figure 8:
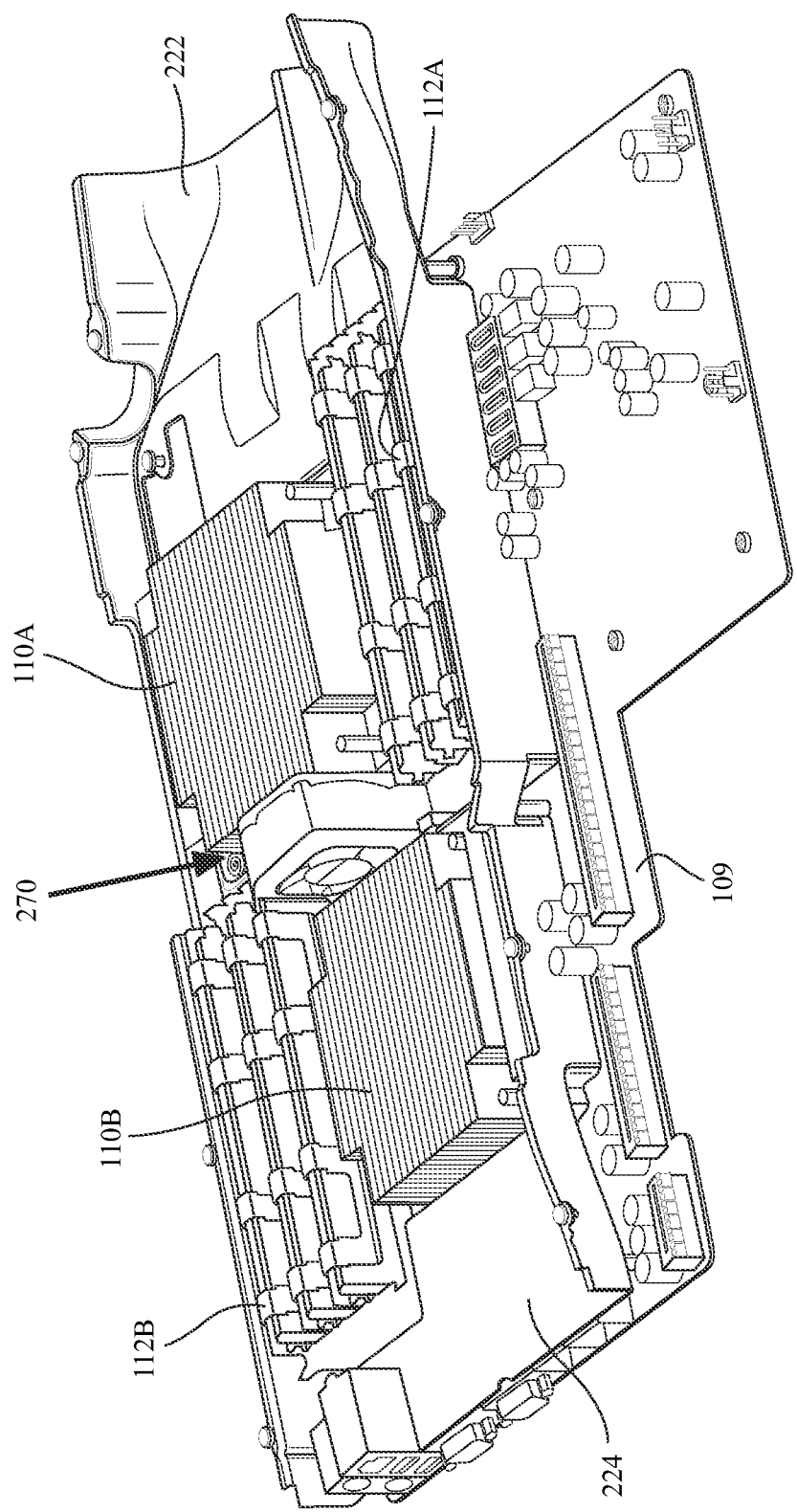
FIG. 8 is a perspective view of the lower portion of an air plenum for directing a flow of cooling air mounted over top of a motherboard and including a booster fan.

FIG. 8 illustrates another embodiment which includes a supplementary cooling fan 270. As shown in FIG. 8, the supplementary cooling fan 270 is located at a mid point along the plenum. A supplementary cooling fan 270 as illustrated in FIG. 8 could be provided if cooling fans at the inlet 220 of the plenum alone do not provide a sufficient airflow to ensure that the most sensitive electrical components are maintained at a sufficiently low temperature.

In alternate embodiments, all of the cooling fans for a plenum could be located inside the plenum. The cooling fans could be located inside the throat of the plenum, or towards the middle of the plenum, as illustrated in FIG. 8. Locating the cooling fans inside the plenum can shorten the overall length of the assembly, which may be desirable or required in certain situations.

In some embodiments, the walls of the plenum may be formed of a material that is highly heat conductive. As a result, those portions of the plenum that are immediately adjacent to a heat producing electrical component will conduct heat energy away from that location to other parts of the plenum. This can help move heat energy away from a first part of the plenum to a second part of the plenum where the cooling air at the second location can help to absorb the heat energy originally generated by the electrical component at the first location.

Similarly, one or more heat spreaders may be mounted on or embedded in the walls of a plenum to help move heat energy from a first location to a second location. FIG. 5 illustrates an embodiment where two heat spreaders 302, 304 are mounted on the top of the plenum. The heat spreaders can move heat energy produced by the second CPU 110B, which is located under first ends of the heat spreaders 302, 304, to a second location over the memory modules 112B, which are located under second ends of the heat spreaders 302, 304. Thus, heat energy produced at a first location by the second CPU 110B can be transferred to air flowing through the plenum at a second location spaced apart from the first location.

The actual configuration of the plenum and the cooling fans can be customized to take into account a multitude of different conditions. For instance, fewer cooling air fans and lower volumes of cooling airflow may be required for a certain type of computer server when only a few of the servers are mounted in a given space. However, if a larger number of the same servers are all located in the space, it may be necessary to increase the cooling airflow or the number of cooling fans for each server to ensure that the sensitive electrical components of the computer servers are kept at a sufficiently low temperature.

Likewise, the anticipated environmental conditions surrounding the computer servers can influence the configuration of the plenum and cooling fans. If the ambient temperature within the space is expected to remain relatively cool, the plenum and cooling fans need only provide a modest amount of cooling capacity. But if the ambient temperature is expected to be quite high, it may be necessary to equip the servers with a plenum and cooling fans that provide a greater amount of cooling capacity.

Similarly, the same basic computer server with the same basic central processing units could require a lower amount of cooling airflow if only a few memory modules are present on the computer motherboard. However, if a large number of memory modules are mounted on the computer motherboard, to increase the capabilities of the server, it may be necessary to increase the flow rate of the cooling air, or it may be necessary to increase the number of cooling fans that are provided.

Factors such as those described above would be taken into account when designing the actual configuration of the plenum and the cooling air fans for any given application. Similarly, the controller running the cooling air fans could be designed with temperature sensors so that the flow rates of the cooling fans can be selectively varied if the temperatures begin to rise above an ideal temperature.

A single plenum may include multiple different types of customizable features which can be used to control and thereby customize the flow of cooling air through the plenum. Thus, a single plenum design could be used for multiple different configurations of computer motherboards, and the flow of cooling air could be optimized for each computer motherboard configuration.

Figure 9:
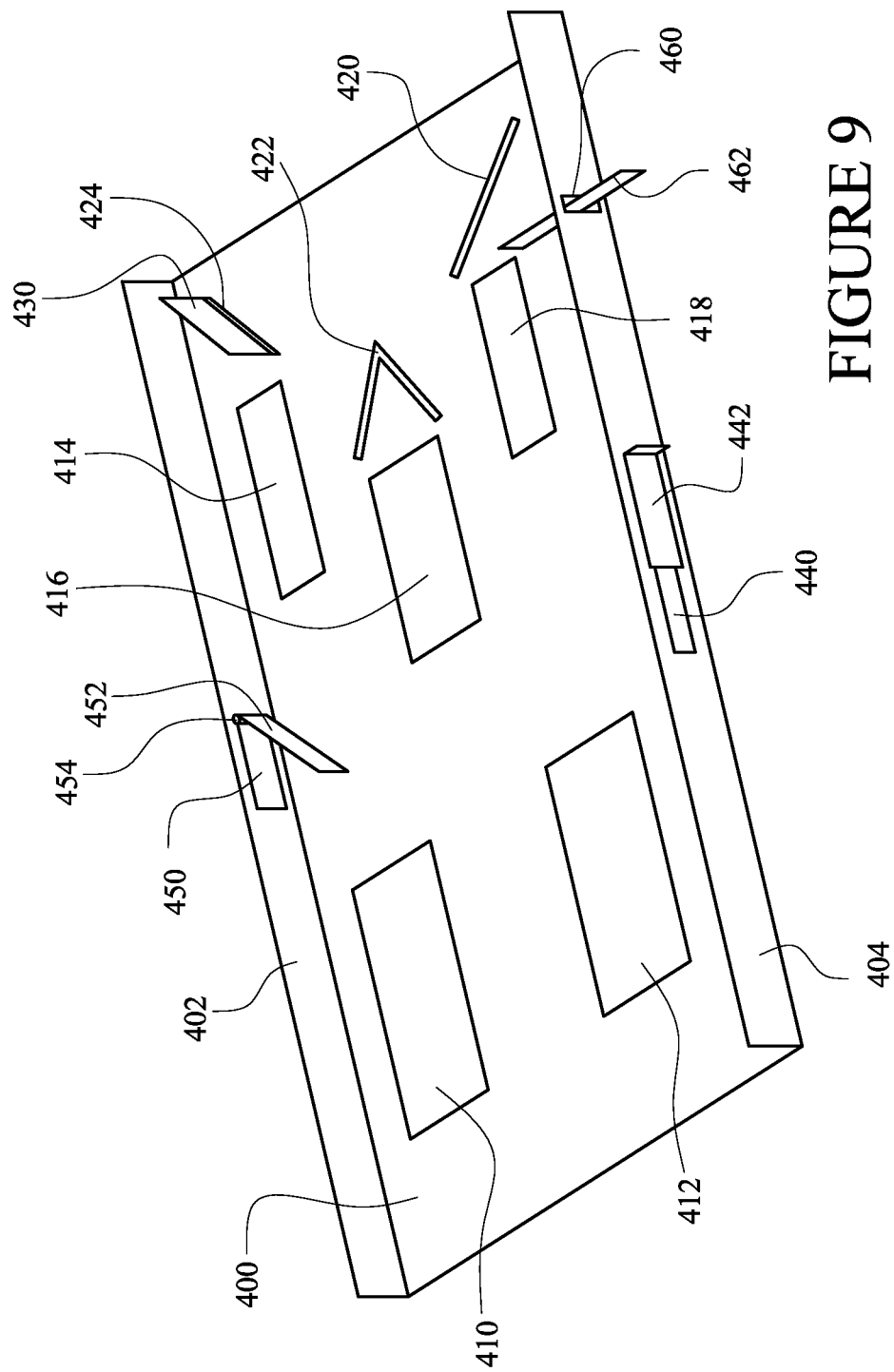
FIG. 9 is a perspective view of the bottom portion of a plenum having various different customizable features that control airflow through the plenum.

FIG. 9 illustrates the bottom portion of a plenum 400 having various customizable features. The bottom surface of the plenum 400 includes apertures 410, 412, 414, 416 and 418 which would allow electrical components mounted on a computer motherboard positioned under the plenum to protrude upward into the interior of the plenum. The plenum also includes a first sidewall 402 and a second sidewall 404.

Slots 420, 422 and 424 are formed on the bottom surface of the plenum. The slots 420, 422 and 424 are configured to receive plates or baffles which can control how cooling air flows through the plenum. Plates or baffles can be mounted in he slots to redirect the airflow, or the plates and baffles can be omitted so that air flows unimpeded through the plenum. FIG. 9 shows that no plates or baffles are mounted in a first angled slot 420 or in a second V-shaped slot 422. However, a plate 430 is mounted in a third angled slot 424.

The plate 430 may be mounted in the third angled slot 424 in situations where no electrical components on a motherboard that require cooling will protrude upward through the aperture 414 adjacent The third slot 424. On the other hand, if the plenum is to be used with a computer motherboard having electrical components that protrude upward through the aperture 414, the plate 430 could be removed from the third slot 424 so that air can flow over the electrical components protruding through the adjacent aperture 414.

Likewise, because no plate or baffle is mounted in the second slot 422, air can flow over any electrical components protruding upward through the aperture 416 adjacent the second slot 422. However, if the plenum were to be used with a computer motherboard that does not include electrical components that would protrude upward through aperture 416, a V-shaped plate or baffle could be mounted in the second slot 422 to re-direct the cooling airflow towards other electrical components that do require cooling.

By providing slots for mounting plates or baffles at selected locations on the plenum, one can custom configure a plenum so that it provides cooling to multiple different configurations of computer motherboards. The slots could also be formed on the sidewalls 402, 404 of the plenum. Further, corresponding slots could be formed on a top wall of the plenum to engage the top edges of the plates or baffles.

Further, although slots are illustrated in FIG. 9, any other method of mounting the plates or baffles could also be used. For example, various fasteners such as screws or clips could be used to mount the plates or baffles. Also, adhesives could be used to mount the plates or baffles, or adhesives could be used in addition to other alternate mounting means. Further, welding or melting of a synthetic material could also be used to affix the plates or baffles to selected locations on the plenum.

FIG. 9 also illustrates that a plate or baffle 462 could be slidably mounted on the second sidewall 404 of the plenum. When the plenum is being configured, the plate 462 could be slid into the interior of the plenum to redirect the airflow through the plenum. Alternatively, the plate 462 could be slid out of the plenum so that air passes through the plenum unimpeded. The plate could also be selectively re-positioned at any time to alter airflow through the plenum to take into consideration actual operating conditions in the plenum, or to fine tune the airflow through the plenum.

FIG. 9 also illustrates that auxiliary openings may be formed in the plenum to admit cooling air into the plenum at selected locations. In the embodiment illustrated in FIG. 9, a rotationally mounted flap 452 is mounted to the first sidewall 402 via a pivot joint 454. The pivot joint could fix the flap 452 in a closed, opened or partially opened position, depending on the air flow requirements.

Also, in some embodiments, the pivot joint 454 may be spring loaded into the closed or opened position. In this instance, when the fans coupled to the plenum are in first operational state, the flap 452 may be held in a first one of the open and closed positions, and when the fans are in a second operational state, the flap may move to the second of the open and closed positions. For example, when the fans are not running, the pivot joint 454 may hold the flap 452 in a closed position so that no air can enter the plenum through the aperture 450 in the first sidewall 402. However, when the fans begin to run, the pivot joint may allow the flap 452 to move to the open position so that air can flow into the plenum through the aperture 450 in the sidewall.

Although the embodiment illustrated in FIG. 9 shows the flap 452 mounted on the inside of the sidewall 402 and opening into the interior of the plenum, in alternate embodiments, the flap could be mounted On the exterior of the sidewall 402 and open outward.

FIG. 9 also illustrates that a cover 422 may be slidably mounted on the second sidewall 404 of the plenum. FIG. 9 shows the cover slid into the open position, which opens an aperture 440 in the second sidewall 404. This could allow air to flow into the plenum through the aperture 440, or air could flow out of the plenum through the aperture 440. Putting the cover into a selected position could customize the plenum for a particular configuration of motherboard, or the cover 442 could be repositioned to fine tune the airflow through the plenum or to take into account actual operating conditions.

In the embodiment discussed above, auxiliary apertures were formed in the sidewalls of the plenum. In alternate embodiments, such auxiliary apertures could also be formed in the bottom or top of the plenum.

Figure 10:
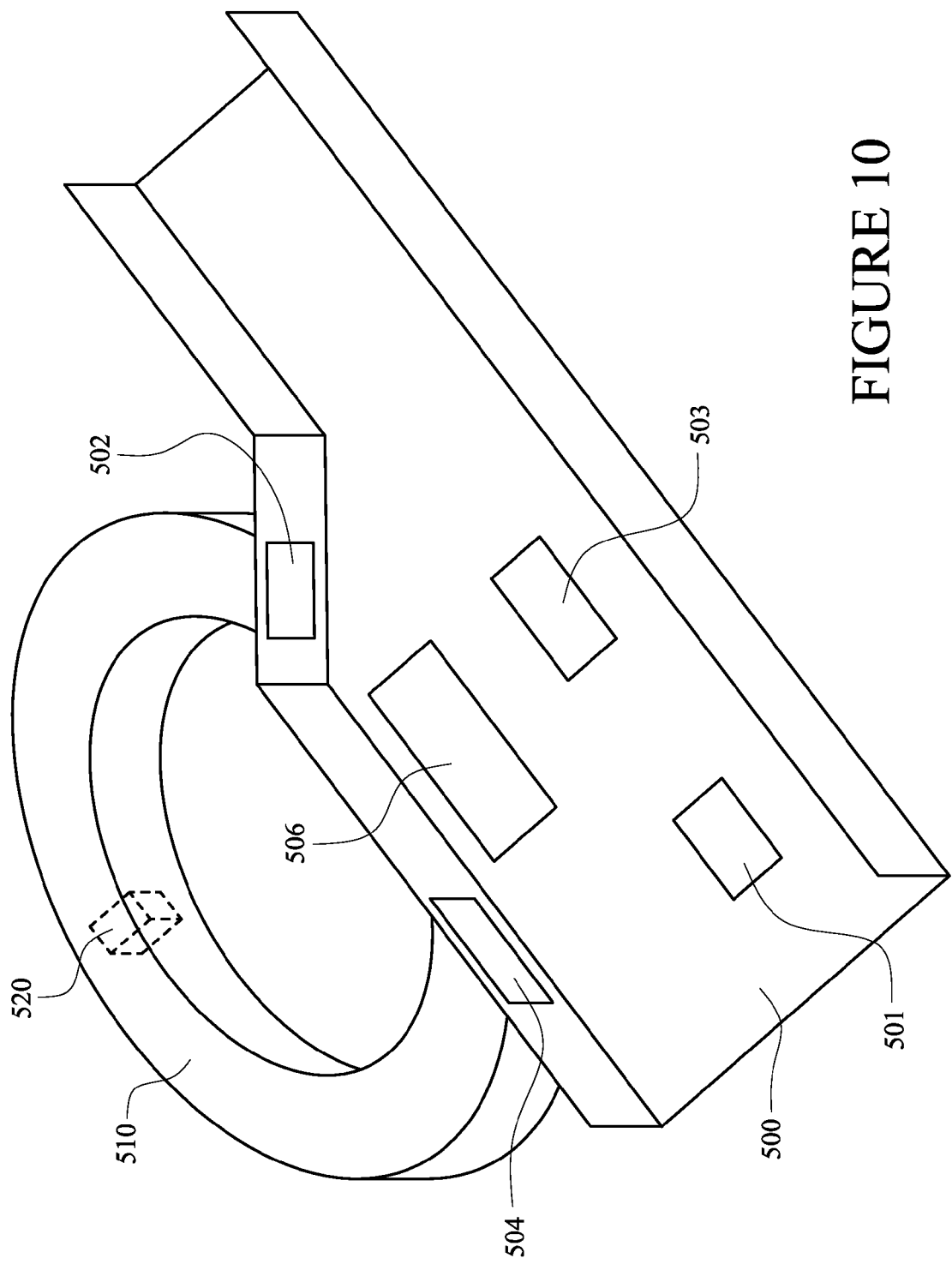
FIG. 10 is a perspective view of the bottom portion of a plenum having a recirculating air passageway.

FIG. 10 illustrates another plenum 500 having apertures 501, 503, 506 that would allow electrical components on a computer motherboard positioned under the plenum to protrude upward into the interior of the plenum. In this embodiment, a recirculation air passageway 510 is attached to a sidewall of the plenum. The recirculation air passageway allows air to exit the plenum through a first opening 502 in the sidewall and then re-enter the plenum through a second opening 504 in the sidewall. An auxiliary fan 520 may or may not be mounted in the recirculation air passageway to help move air through the recirculation passageway.

The recirculation passageway might be used to increase the total amount of heat energy that is absorbed by the cooling air as it traverses the plenum. For example, air passing over electrical components protruding through the aperture 506 on the bottom of the plenum would absorb heat energy from the electrical components. However, if the temperature of the cooling air only increases a small amount during its first pass over the electrical components, it may still be capable of absorbing considerably more heat energy. If that is the case, the air could enter the first opening 502, traverse the recirculation air passageway 510 and exit the second opening 504. The cooling air could then make a second pass across the electrical components protruding through the aperture 506 to absorb additional heat energy from the electrical components. Thus, providing a recirculation air passageway may increase the total amount of heat energy that is absorbed by the air during a single pass through the plenum.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

The invention claimed is:

1. A plenum for guiding cooling air across electrical components that are mounted on a printed circuit board, comprising:
   a plenum body including an upper wall, a lower wall and sidewalls joining the lower and upper walls, the plenum body including:
      an inlet for the cooling air entering the plenum body;
      an outlet for the cooling air exiting the plenum body; and
      first and second apertures in the lower wall,
   wherein the first aperture is configured to receive a central processing module, wherein the second aperture is configured to receive at least one memory module, and wherein the plenum body is configured such that when it is mounted over the printed circuit board bearing the central processor module and the at least one memory module, the central processor module extends upward through the first aperture into an interior of the plenum body, and the at least one memory module extends upward through the second aperture and into the interior of the plenum body, and
   wherein the upper wall, the lower wall and the sidewalls surround the interior of the plenum body.

2. The plenum of claim 1, further comprising at least one lower protrusion that extends upward from the lower wall, the at least one lower protrusion being configured to guide a flow of the cooling air through the plenum body.

3. The plenum of claim 2, further comprising at least one upper protrusion that extends downward from the upper wall, the at least one upper protrusion being configured to guide a flow of the cooling air through the plenum body.

4. The plenum of claim 1, further comprising at least one upper protrusion that extends downward from the upper wall, the at least one upper protrusion being configured to guide a flow of the cooling air through the plenum body.

5. The plenum of claim 1, wherein the plenum body comprises an upper portion and a lower portion that are joined together to form the plenum body, the upper wall being part of the upper portion and the lower wall being part of the lower portion.

6. The plenum of claim 1, further comprising a throat portion that is detachably mounted to at least one of the inlet or the outlet of the plenum body.

7. The plenum of claim 6, wherein the throat portion is configured to receive at least one cooling fan.

8. The plenum of claim 6, wherein the throat portion is configured to receive a plurality of cooling fans.

9. A cooling apparatus for cooling electrical components that are mounted on a printed circuit board, comprising:
the plenum of claim 1; and
at least one cooling fan that is mounted adjacent one of the inlet or the outlet of the plenum.

10. The cooling apparatus of claim 9, further comprising a cooling fan controller, wherein the at least one cooling fan comprises first and second cooling fans that are operatively coupled to the cooling fan controller, and wherein the cooling fan controller causes the first cooling fan to generate a different volume of airflow than the second cooling fan.

11. The cooling apparatus of claim 9, wherein the plenum body comprises a protrusion on one of the upper wall and the lower wall, the protrusion extending inward toward an interior of the plenum body, wherein the at least one cooling fan comprises first and second cooling fans, and wherein the protrusion is configured to guide a first airflow generated by the first cooling fan separately from a second airflow generated by the second cooling fan.

12. The cooling apparatus of claim 9, further comprising a supplementary cooling fan that is located in the plenum body at a location between the inlet and the outlet.

13. The cooling apparatus of claim 12, wherein the supplementary cooling fan is located adjacent at least one of the first or second apertures in the lower wall of the plenum body such that when the plenum is mounted over the printed circuit board, the supplementary cooling fan will increase a flow rate of the cooling air across an electrical component of the electrical components on the printed circuit board that protrudes into the interior of the plenum body.

14. A computer, comprising:
a housing;
a computer motherboard mounted in the housing, wherein a central processor and at least one memory module are mounted on the computer motherboard; and a plenum comprising:
a plenum body including an upper wall, a lower wall and sidewalls joining the lower and upper walls, the plenum body including:
an inlet for cooling air entering the plenum body;
an outlet for the cooling air exiting the plenum body; and
first and second apertures in the lower wall,
wherein the plenum body is mounted over the computer motherboard such that the central processor extends upward though the first aperture and into an interior of the plenum body, and such that the at least one memory module extends upward through the second aperture and into the interior of the plenum body, and
wherein the upper wall, the lower wall and the sidewalls surround the interior of the plenum body.

15. The computer of claim 14, wherein an upper protrusion on the upper wall of the plenum body extends downward from the upper wall between the central processor and the at least one memory module.

16. The computer of claim 15, further comprising a lower protrusion on the lower wall of the plenum body that extends upward from the lower wall between the central processor and the at least one memory module, the upper protrusion and lower protrusion forming a barrier between the central processor and the at least one memory module.

17. The computer of claim 14, wherein the central processor comprises a first central processor, and further comprising a second central processor that is also mounted on the computer motherboard, wherein a third aperture is formed on the lower wall of the plenum body, and wherein the second central processor extends upward through the third aperture into the interior of the plenum body.

18. The computer of claim 17, wherein at least one protrusion is formed on the plenum body, the protrusion extending inward towards the interior of the plenum body, the at least one protrusion being configured to separate a flow of the cooling air through the plenum into a first flow of the cooling air that passes over the first central processor and a second flow of the cooling air that passes over the second central processor.

* * * * *